(12) United States Patent
Yen et al.

(10) Patent No.: US 8,860,114 B2
(45) Date of Patent: Oct. 14, 2014

(54) STRUCTURE AND METHOD FOR A FISHBONE DIFFERENTIAL CAPACITOR

(75) Inventors: Hsiao-Tsung Yen, Tainan (TW); Yu-Ling Lin, Taipei (TW); Chin-Wei Kuo, Hsinchu (TW); Ho-Hsiang Chen, Hsinchu (TW); Min-Chie Jeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 13/411,052

(22) Filed: Mar. 2, 2012

(65) Prior Publication Data

US 2013/0228894 A1   Sep. 5, 2013

(51) Int. Cl.
*H01L 29/92* (2006.01)

(52) U.S. Cl.
USPC ............ 257/306; 361/306.2; 73/504.12

(58) Field of Classification Search
CPC .............. H01L 23/5223; H01L 23/5225
USPC ............ 257/306; 361/306.2; 73/504.12
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,257,059 B1 * | 7/2001 | Weinberg et al. ......... 73/504.16 |
| 6,322,903 B1 | 11/2001 | Siniaguine et al. |
| 6,383,858 B1 | 5/2002 | Gupta et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine et al. |
| 6,664,129 B2 | 12/2003 | Siniaguine et al. |
| 6,693,361 B1 | 2/2004 | Siniaguine et al. |
| 6,740,582 B2 | 5/2004 | Siniaguine |
| 6,743,671 B2 | 6/2004 | Hu et al. |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |

(Continued)

OTHER PUBLICATIONS

Unpublished U.S. Appl. No. 13/158,044, filed Jun. 10, 2011 entitled "A Vertical Interdigitated Semiconductor Capacitor," 33 pages.
Unpublished U.S. Appl. No. 13/212,982, filed Aug. 18, 2011 entitled "Vertically Oriented Semiconductor Device and Shielding Structure Thereof," 44 pages.

(Continued)

*Primary Examiner* — Steven J Fulk
(74) *Attorney, Agent, or Firm* — Haynes and Boone, LLP

(57) ABSTRACT

The present disclosure provides an integrated circuit. The integrated circuit includes a substrate having a surface that is defined by a first axis and a second axis perpendicular to the first axis; and a capacitor structure disposed on the substrate. The capacitor structure includes a first conductive component; a second conductive component and a third conductive component symmetrically configured on opposite sides of the first conductive component. The first, second and third conductive components are separated from each other by respective dielectric material.

17 Claims, 12 Drawing Sheets

(56) References Cited

U.S. PATENT DOCUMENTS

| | | | |
|---|---|---|---|
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,290,449 B2 * | 11/2007 | Ao | 73/510 |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,485,912 B2 | 2/2009 | Wang | |
| 2003/0183864 A1 * | 10/2003 | Miyazawa | 257/307 |
| 2004/0182158 A1 * | 9/2004 | Tsubaki | 73/514.32 |
| 2005/0167702 A1 * | 8/2005 | Booth et al. | 257/207 |
| 2005/0274181 A1 * | 12/2005 | Kutsuna et al. | 73/504.12 |
| 2007/0126078 A1 * | 6/2007 | Huang et al. | 257/532 |
| 2007/0296013 A1 * | 12/2007 | Chang et al. | 257/306 |
| 2009/0090951 A1 * | 4/2009 | Chang et al. | 257/306 |
| 2009/0290283 A1 * | 11/2009 | Fong et al. | 361/306.2 |
| 2009/0296313 A1 * | 12/2009 | Chiu et al. | 361/311 |
| 2010/0141354 A1 | 6/2010 | Cho | |
| 2010/0214041 A1 | 8/2010 | Cho | |
| 2010/0309605 A1 * | 12/2010 | Lin | 361/306.3 |
| 2011/0188168 A1 * | 8/2011 | Rogers | 361/281 |

OTHER PUBLICATIONS

Unpublished U.S. Appl. No. 13/280,786, filed Oct. 25, 2011 entitled "Structure and Method for a High-K Transformer With Capacitive Coupling," 46 pages.

Unpublished U.S. Appl. No. 13/227,242, filed Sep. 7, 2011 entitled "A Horizontal Interdigitated Capacitor Structure with Vias," 44 pages.

Unpublished U.S. Appl. No. 13/272,866, filed Oct. 13, 2011 entitled "Vertically Oriented Semiconductor Device and Shielding Structure Thereof," 38 pages.

Kawano, Yoichi, et al., "A 77GHz Transceiver in 90nm CMOS," 2009 IEEE International Solid-State Circuits Conference, 978-1-4244-3457-2/09, ISSCC 2009/Session 18/Ranging and Gb/s Communication/18.3, 3 pages.

Lim, Chee Chong, et al., "Fully Symmetrical Monolithic Transformer (True 1:1) for Silicon RFIC," IEEE Transactions on Microwave Theory and Techniques, vol. 56, No. 10, Oct. 2008, pp. 2301-2311.

Unpublished U.S. Appl. No. 13/212,987, filed Aug. 18, 2011 entitled "Vertically Oriented Semiconductor Device and Shielding Structure Thereof," 45 pages.

Unpublished U.S. Appl. No. 13/212,976, filed Aug. 18, 2011 entitled "Vertically Oriented Semiconductor Device and Shielding Structure Thereof," 44 pages.

* cited by examiner

STRUCTURE AND METHOD FOR A FISHBONE DIFFERENTIAL CAPACITOR

CROSS-REFERENCE

The present disclosure is related to the following commonly-assigned U.S. patent applications, the entire disclosures of which are incorporated herein by reference: U.S. patent application Ser. No. 13/158,044 filed Jun. 10, 2011 by inventors Hsiu-Ying Cho for "A VERTICAL INTERDIGITATED SEMICONDUCTOR CAPACITOR"; U.S. patent application Ser. No. 13/212,982 filed Aug. 20, 2011 by inventor Hsiu-Ying Cho for "VERTICALLY ORIENTED SEMICONDUCTOR DEVICE AND SHIELDING STRUCTURE THEREOF"; U.S. patent application Ser. No. 13/280,786 filed Oct. 25, 2011 by inventor Hsiao-Tsung Yen for "STRUCTURE AND METHOD FOR A HIGH-K TRANSFORMER WITH CAPACITIVE COUPLING"; U.S. patent application Ser. No. 13/272,866 filed Oct. 13, 2011 by inventor Hsiu-Ying Cho for "VERTICALLY ORIENTED SEMICONDUCTOR DEVICE AND SHIELD STRUCTURE THEREOF"; and U.S. patent application Ser. No. 13/227,242 filed Sep. 7, 2011 by inventors Hsiu-Ying Cho for "A HORIZONTAL INTERDIGITATED CAPACITOR STRUCTURE WITH VIAS".

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component or line that can be created using a fabrication process) has decreased.

Various active or passive electronic components can be formed on a semiconductor IC. For example, a semiconductor capacitor may be formed as a passive electronic component. Traditionally, a semiconductor capacitor may have a metal-oxide-metal (MOM) structure. As device sizes continue to decrease, the MOM structure for traditional semiconductor capacitors may encounter problems such as excessive area consumption, low capacitance density, and/or high fabrication costs.

Therefore, while existing semiconductor capacitor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
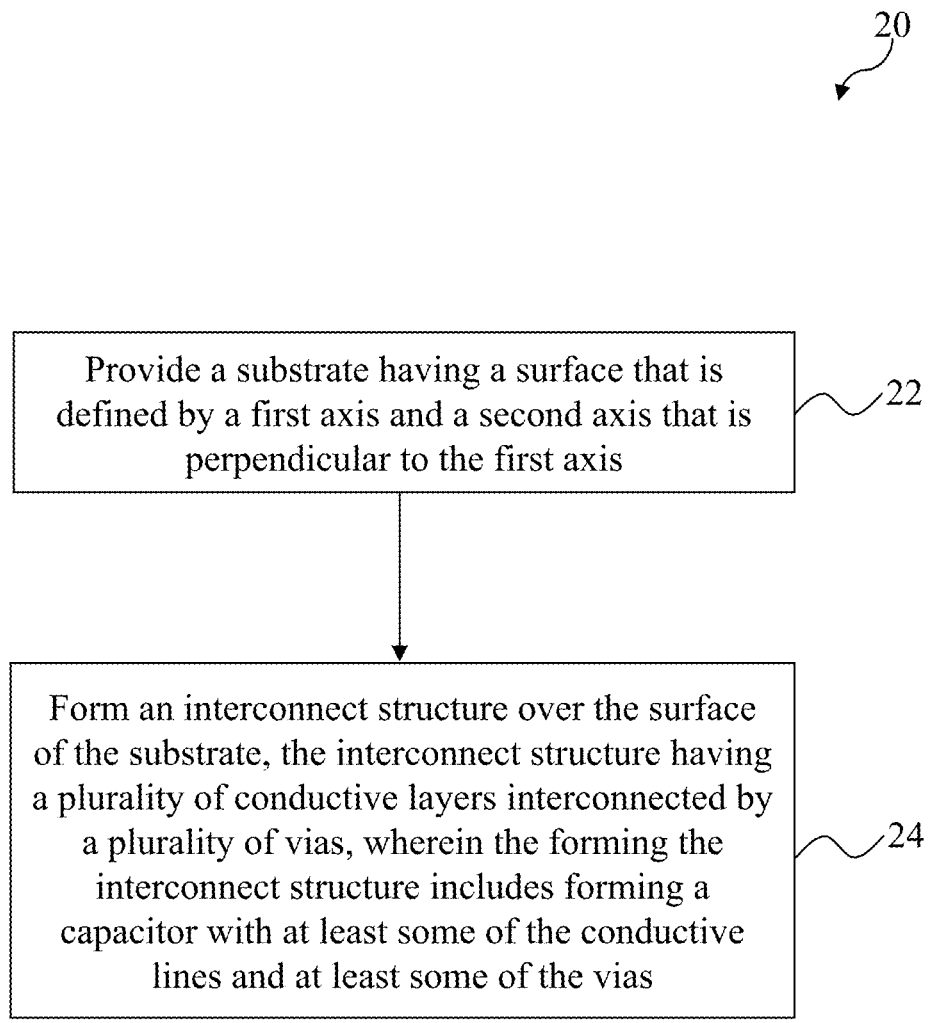
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
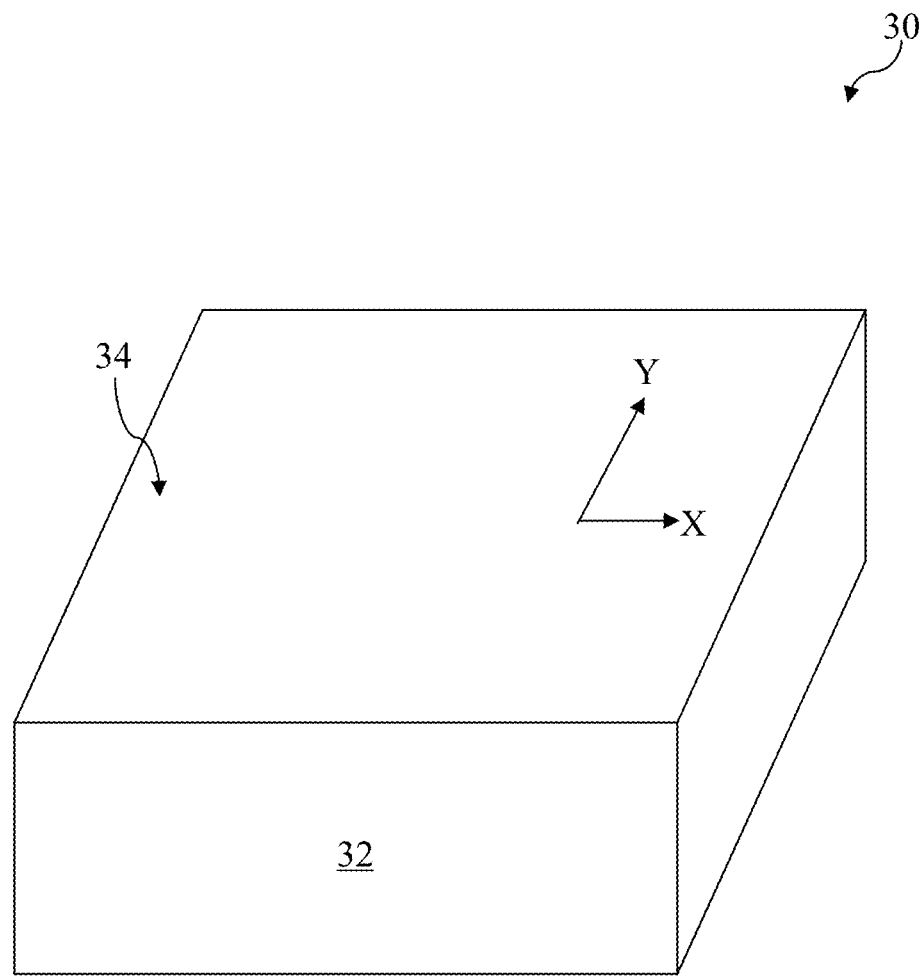
FIGS. 2-3 are diagrammatic fragmentary cross-sectional side views of a semiconductor structure having a capacitor structure at different stages of fabrication.
Figure 3:
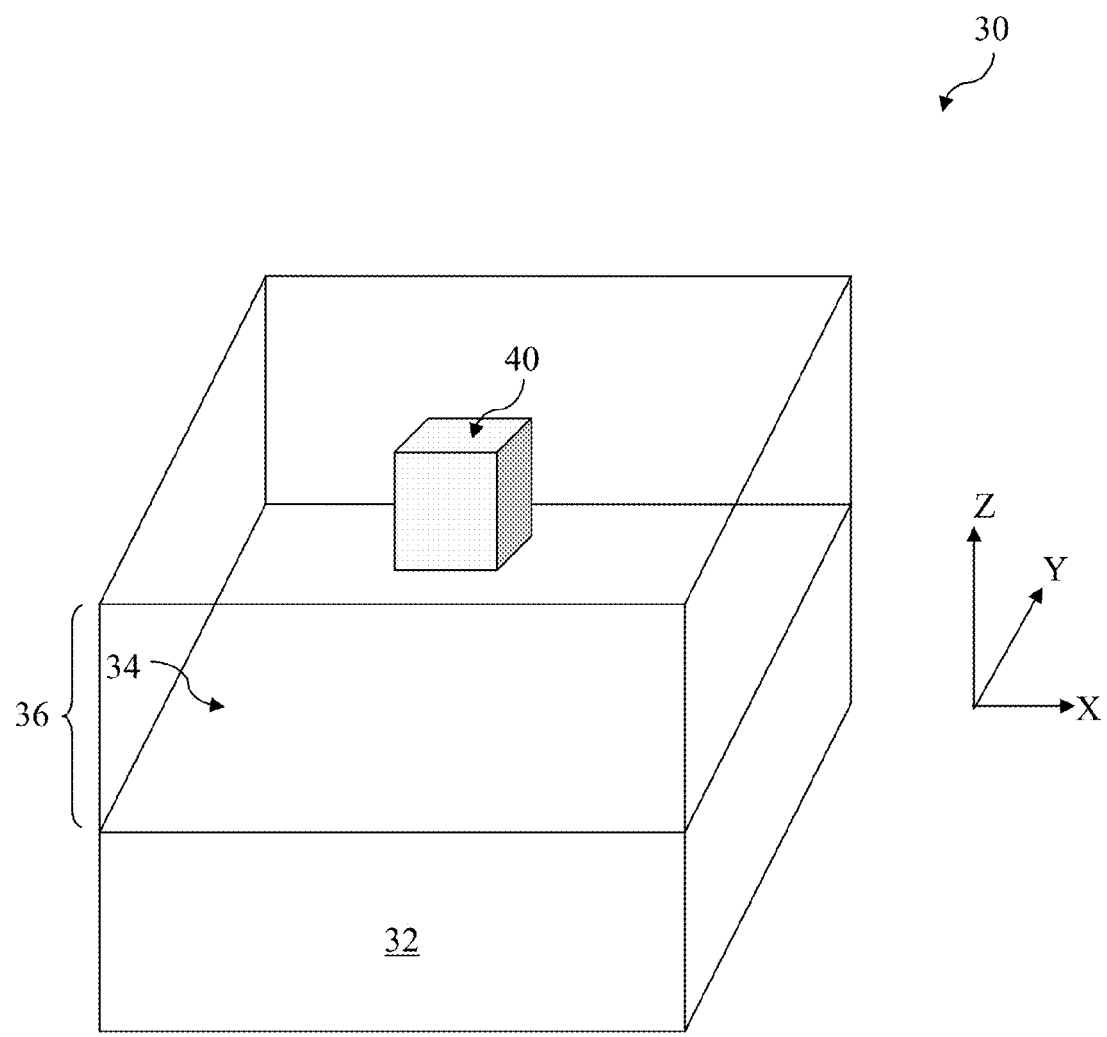

Illustrated in FIG. 1 is a flowchart of a method 20 for fabricating a semiconductor device that includes a capacitor structure. FIGS. 2 and 3 are diagrammatic fragmentary cross-sectional side views of a semiconductor device 30 fabricated according to the various aspects of the present disclosure. The semiconductor device 30 and the method 20 making the same are collectively described with references to FIGS. 1 through 3.

The semiconductor device 30 may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that the Figures discussed herein have been simplified for a better understanding of the inventive concepts of the present disclosure. Accordingly, it should be noted that additional processes may be provided before, during, and after the method 20 of FIG. 1, and that some other processes may only be briefly described herein.

Referring to FIGS. 1 and 2, the method 20 begins with block 22 in which a substrate 32 is provided. In one embodiment, the substrate 32 is a silicon substrate doped with either a P-type dopant such as boron, or doped with an N-type dopant such as arsenic or phosphorous. The substrate 32 may be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 32 could include an epitaxial layer (epi layer), may be strained for performance enhancement, and may include a silicon-on-insulator (SOI) structure.

Although not specifically shown for the sake of simplicity, a plurality of electronic components may be formed in the substrate 32. For example, source and drain regions of FET transistor devices may be formed in the substrate. The source and drain regions may be formed by one or more ion implantation or diffusion processes. As another example, isolation structures such as shallow trench isolation (STI) structures or deep trench isolation (DTI) structures may be formed in the substrate to provide isolation for the various electronic components. These isolation structures may be formed by etching recesses (or trenches) in the substrate 32 and thereafter filling the recesses with a dielectric material, such as silicon oxide, silicon nitride, silicon oxy-nitride, fluoride-doped silicate (FSG), and/or a low-k dielectric material known in the art.

The substrate 32 has an upper surface 34. The surface 34 is a two-dimensional plane that is defined by an X-axis and a Y-axis, where the X-axis and Y-axis are perpendicular, or orthogonal, to each other. The X-axis and the Y-axis may also be referred to as an X-direction and a Y-direction, respectively.

Referring to FIGS. 1 and 3, the method 20 begins with block 24 in which an interconnect structure 36 is formed over the upper surface 34 of the substrate 32. In other words, the interconnect structure 36 is disposed over the surface 34 in a Z-axis, or a Z-direction that is perpendicular to the surface 34. The interconnect structure 36 includes a plurality of patterned dielectric layers and interconnected conductive layers. These interconnected conductive layers provide interconnections (e.g., wiring) between circuitries, inputs/outputs, and various doped features formed in the substrate 32. In more detail, the interconnect structure 36 may include a plurality of interconnect layers, also referred to as metal layers (e.g., M1, M2, M3, etc). Each of the interconnect layers includes a plurality of interconnect features, also referred to as metal lines. The metal lines may include metal, metal alloy, and/or metal silicide. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by processes including physical vapor deposition (PVD), chemical vapor deposition (CVD), sputtering, plating, or combinations thereof.

The interconnect structure 36 includes an interlayer dielectric (ILD) layer that provides isolation between the first metal layer and the substrate and include inter-metal dielectric (IMD) layers that provide isolation between the metal layers. The ILD and IMD layers may include a dielectric material such as an oxide material. The interconnect structure 36 also includes a plurality of vias/contacts that provide electrical connections between the different metal layers and/or the features on the substrate. For the sake of simplicity, the metal lines in the interconnect layers, the vias/contacts interconnecting the metal lines, and the dielectric material separating them are not specifically illustrated herein.

The interconnect structure 36 is formed in a manner such that a capacitor structure 40 is formed in the interconnect structure. The capacitor structure 40 is formed with at least some of the conductive lines and at least some of the vias of the interconnect structure. In one embodiment, the capacitor structure is formed to have a first conductive component; a second conductive component and a third conductive component. The second and third conductive components are symmetrically configured on opposite sides of the first conductive component. The first, second and third conductive components are separated from each other by respective dielectric material.

According to various aspects of the present disclosure, a capacitor structure is formed in the interconnect structure 36. Or stated differently, various components of the interconnect structure 36 constitute the capacitor structure disclosed herein. The capacitor structure is not shown in FIG. 3 for the sake of simplicity, but its various embodiments are illustrated in more detail in FIGS. 4 through 21 and will be discussed in more detail by the following paragraphs.

Figure 4:
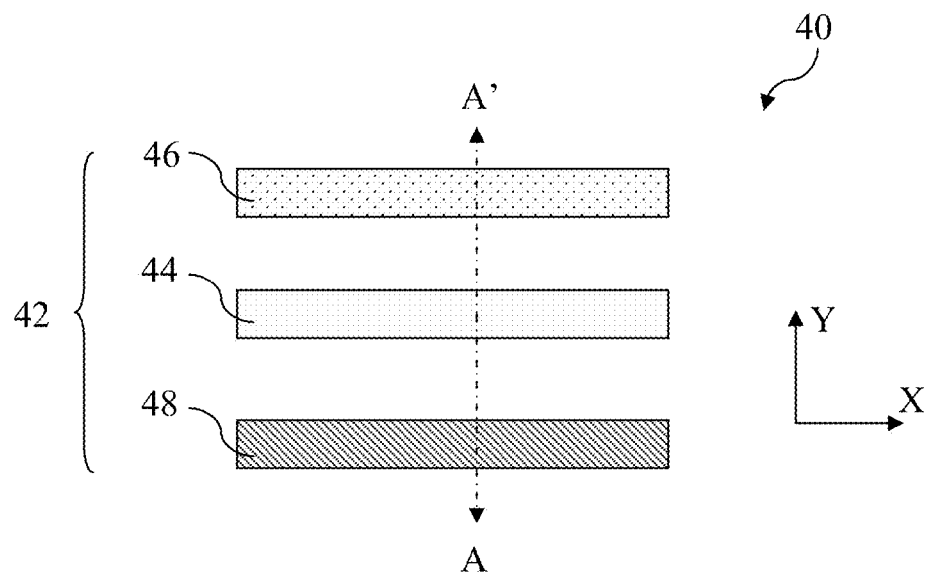
FIG. 4 is a diagrammatic fragmentary top view of the capacitor structure of FIG. 3 in one embodiment.

Referring now to FIG. 4, a diagrammatic top view from the Z-axis of an embodiment of the capacitor structure 40 is illustrated according to aspects of the present disclosure. The capacitor structure 40 includes a first conductive component 44, a second conductive component 46, and a third conductive component 48. The second and third conductive components are symmetrically configured on opposite sides of the first conductive component. The first, second and third conductive components are separated from each other by respective dielectric material, such as ILD layer of the interconnect structure.

In one embodiment, the capacitor structure 40 includes a collective capacitor 42 having two capacitors combined together. The first and second capacitors are symmetrically designed and configured. The first and second capacitors share a common ground. In the present embodiment, the first conductive component is the common ground plate. The second and first conductive components constitute the first capacitor where the second conductive component is another plate of the first capacitor. The third and first conductive components constitute the second capacitor where the third conductive component is another plate of the first capacitor. Particularly, the second conductive component is configured to be connected with a first signal line and the third conductive component is configured to be connected with a second signal line that is in an opposite phase of the first signal line. In furtherance of the embodiment, the first signal line is operable to have a first alternating current of a magnitude, a frequency and a first phase. The second signal line is operable to have a second alternating current of the same magnitude, same frequency and the opposite phase. State differently, the phase difference between the first and second alternating currents are substantially 180 degree. In one example, the phase difference is close to 180 degree with ±5 degree, based on signal oscillator design quality and the process stability. In another example, the first alternating current is in its positive peak (+V) and the second alternating current is in its negative peak (−V). Similarly, the second alternating current is in its positive peak (+V) and the first alternating current is in its negative peak (−V). The first and second capacitors are configured to form a differential capacitor.

In another embodiment, the first, second and third conductive components 44/46/48 each include a stem feature and a plurality of branch features. Particularly, the first conductive component includes a first stem feature and a plurality of first branch features. The second conductive component includes a second stem feature and a plurality of second branch features. The third conductive component includes a third stem feature and a plurality of third branch features. The first branch features are interdigitated with the second branch features on one side of the first stem feature. The first branch features are interdigitated with the third branch features on another side of the first stem feature.

It is also understood that the relative configuration of the conductive components 42 and 44/46/48 is not critical. For example, the components 46 and 48 may be rotated, flipped, or switched in other embodiments.

It is also understood that the dielectric material of the interconnect structure 36 serves as the dielectric between the various conductive components of the capacitor structure 40. In FIG. 4, the dielectric material separates and electrically isolates the various parts of one conductive component (such as 44) from the various parts of another conductive component (such as 46 or 48). Depending on the need and function to be performed by the capacitor structure 40, the dielectric material of the interconnect structure 36 can be carefully chosen so as to effect the desired capacitance. For example for illustration, the capacitance for a parallel plate capacitor can be calculated with the following equation:

$$C = \varepsilon_r \varepsilon_0 \frac{A}{d}$$

where C is the capacitance; A is the area of overlap of the two plates; $\varepsilon_r$ is the dielectric constant of the material between the plates; $\varepsilon_0$ is the electric constant ($\varepsilon_0 \approx 8.854 \times 10^{-12}$ F m$^{-1}$); and d is the separation between the plates. As such, if a high capacitance capacitor is desired, the dielectric material of the interconnect structure can be chosen to have a high dielectric constant.

Figure 5:
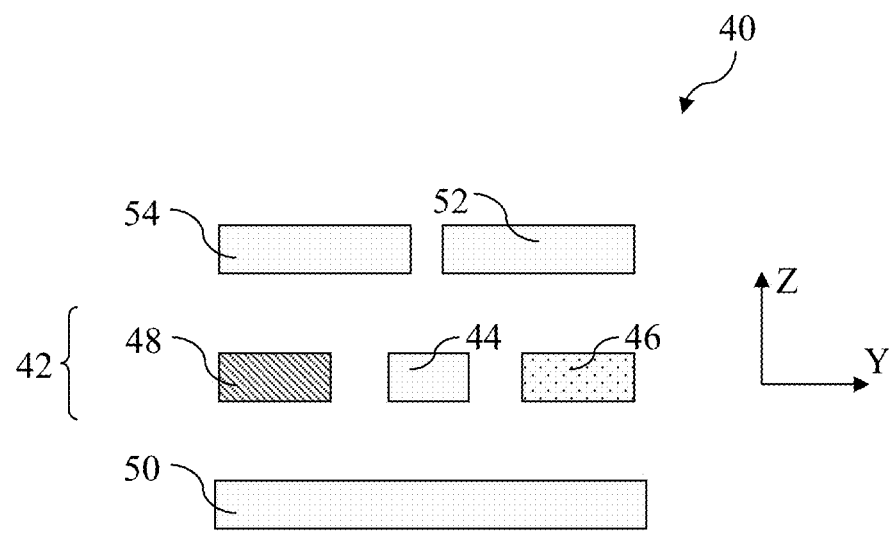
FIG. 5 is a diagrammatic fragmentary cross-sectional view of the capacitor structure of FIG. 4 with a shielding structure in one embodiment.

In another embodiment, the capacitor structure 40 additionally includes shielding plates configured and connected with the first, second and third conductive components of the capacitor structure 40. One embodiment of the shielding plates is illustrated in FIG. 5 in a diagrammatic sectional view from the X-axis. Referring to FIG. 5, the capacitor structure 40 includes a collective capacitor 42 having the first, second and third conductive components 44/44/48. The collective capacitor 42 is similar to that of FIG. 4. For example, the second and third conductive components are symmetrically configured on opposite sides of the first conductive component. The first, second and third conductive components are separated from each other by respective dielectric material, such as ILD layer of the interconnect structure. According to the present embodiment, the collective capacitor 42 of FIG. 5 is a sectional view of the collective capacitor 42 of FIG. 4 taken from the virtual line AA'.

The capacitor structure 40 further a first shielding plate 50 electrically connected to the first conductive component 44, a second shielding plate 52 electrically connected to the second conductive component 46, and a third shielding plate 50 electrically connected to the third conductive component 48. The first, second and third shielding plates are configured to be surrounding the collective capacitor 42, such as sandwiching the collective capacitor 42.

In the present embodiment, the first shielding plate 50 is disposed underlying the collective capacitor 42 and is connected to the first conductive component 44. The second shielding plate 52 is disposed overlying the second conductive component 46 and is connected to the second conductive component 46. Similarly, the third shielding plate 54 is disposed overlying the third conductive component 48 and is connected to the third conductive component 48. The first, second and third shielding plates are configured to sandwich the collective capacitor 42. A Z direction (or Z axis) is defined as a direction perpendicular to both X direction and Y direction. The first shielding plate 50, the collective capacitor 42, and the shielding plates 52/54 are extended along the Z direction.

Figure 6:
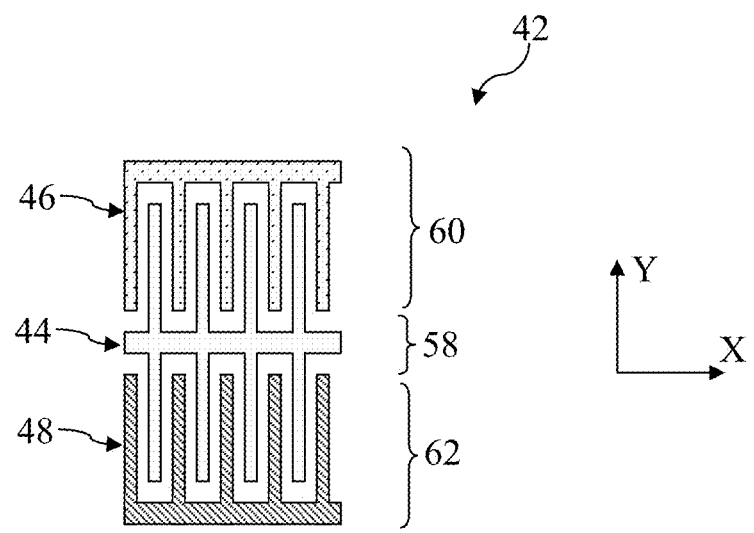
FIG. 6 is a top view of the capacitor structure of FIG. 4 in another embodiment.
Figure 7:
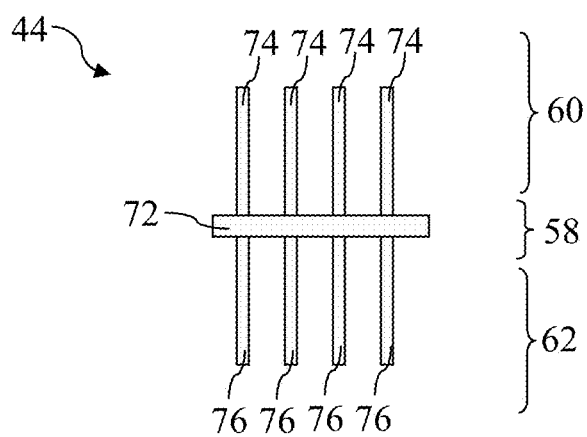
FIGS. 7, 8 and 9 are fragmentary top views of the capacitor structure of FIG. 6 in various embodiments.
Figures 8, 9:
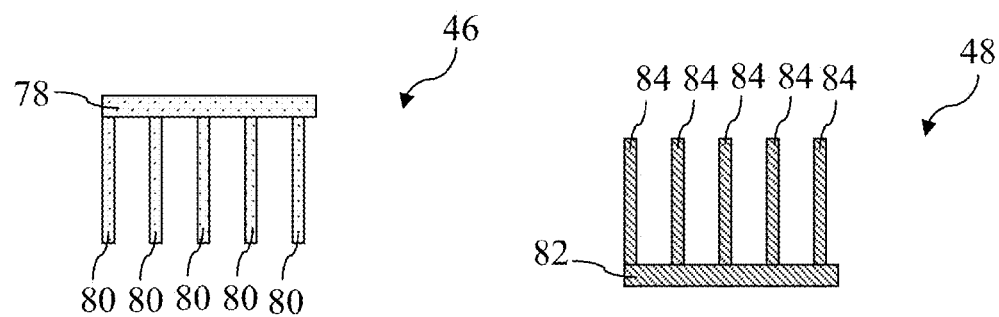

The capacitor structure 40 is further described with reference to FIGS. 6 through 9 according to one embodiment. FIG. 6 is a top view of the capacitor structure 40 having a collective capacitor 42. FIGS. 7 through 9 are fragmentary top views of the capacitor structure 40 of FIG. 6. The collective capacitor 42 includes the first conductive component 44, the second conductive component 46, and the third conductive component 48. The collective capacitor 42 is formed in various regions of the substrate. Specifically, a first region 58 is adjacent a second region 60 from one side and is adjacent a third region 62 from another side.

The first, second and third conductive components 44/46/48 each include a stem feature and a plurality of branch features. Particularly, the first conductive component 44 includes a first stem feature 72 and a plurality of first branch features that connect with the first stem feature 72 and extend to both sides of the first stem feature 72, as further illustrated in FIG. 7. The first branch features on one side are referred to as left branch features (or first side branch features) 74 and the first branch features on another side are referred to as right branch features (or second side branch features) 76. The first stem feature 72 is extended in the X direction while the left and right branch features are extended in the Y direction perpendicular to the X direction. The first stem feature 72 is disposed within the first region 58. The left branch features 74 are extended from the first stem feature 72 to the second region 60. The right branch features 76 are extended from the first stem feature 72 to the third region 62.

The second conductive component 46 includes a second stem feature 78 and a plurality of second branch features 80 that connect with the second stem feature 78 and extend to one side of the second stem feature 78, as further illustrated in FIG. 8. The second stem feature 78 is extended in the X direction while the second branch features 80 are extended in the Y direction. The second stem feature 78 and the second branch features 80 are disposed within the second region 60.

The third conductive component 48 includes a third stem feature 82 and a plurality of third branch features 84 that connect with the third stem feature 82 and extend to one side of the third stem feature 82, as further illustrated in FIG. 9. The third stem feature 82 is extended in the X direction while the third branch features 84 are extended in the Y direction. The third stem feature 82 and the third branch features 84 are disposed within the third region 62.

Furthermore, the first side branch features 74 of the first conductive component 44 and the second branch features 80 of the second conductive component 46 are interdigitated in the second region 60. In one embodiment, the first side branch features 74 of the first conductive component 44 and the second branch features 80 of the second conductive component 46 are interdigitated in the X direction. Similarly, the second side branch features 76 of the first conductive component 44 and the third branch features 84 of the third conductive component 48 are interdigitated in the third region 62. In one embodiment, the second side branch features 76 of the first conductive component 44 and the third branch features 84 of the third conductive component 48 are interdigitated in the X direction.

Figure 10:
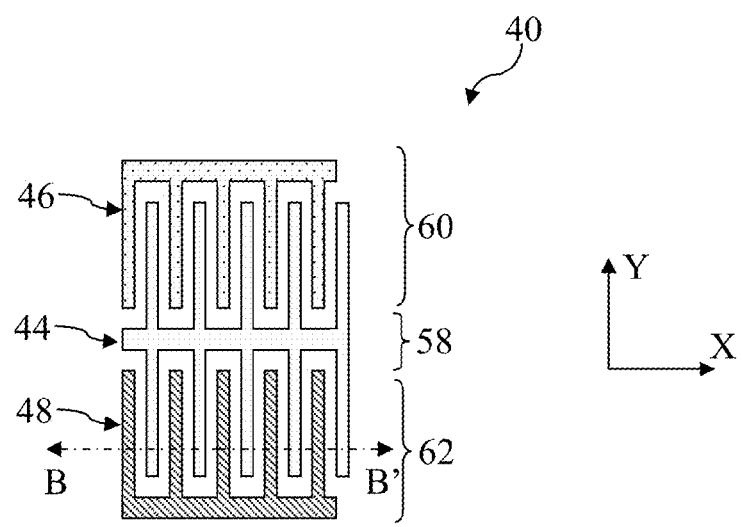
FIG. 10 is a top view of the capacitor structure of FIG. 4 in another embodiment.
Figure 11:
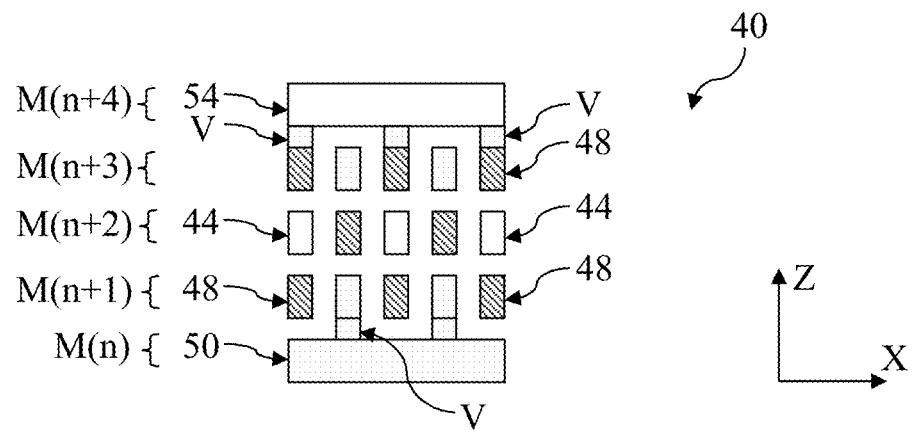
FIG. 11 is a sectional view of the capacitor structure of FIG. 4 in another embodiment.

FIG. 10 is a fragmentary top view of the capacitor structure 40 and FIG. 11 is a fragmentary sectional view of the capacitor structure 40 constructed according to various embodiments. The number of branch features may be odd or alternatively even. For example, the number of the first branch features of the first conductive component 44 is even, such as illustrated in FIG. 6 or FIG. 10. In another example, the number of the second (or third) branch features of the second (or third) conductive component is odd (as illustrated in FIG. 6) or even (as illustrated in FIG. 10).

In another embodiment, the capacitor structure 40 includes shielding features surrounding the collective capacitor 42. In yet another embodiment, the collective capacitor 42 is distributed in more than one metal layers of the interconnect structure. The portion of the collective capacitor 42 disposed in each layer may be designed to have a symmetrical structure, such as those shown in FIGS. 7 and 10, but with different configurations. Other configurations include those illustrated in FIGS. 12 and 13 that will be further described later. Various portions of the collective capacitor 42 are stacked. One example of the capacitor structure 40 is illustrated in FIG. 11, which is a sectional view of the capacitor structure 40 in FIG. 10 taken from the virtual line BB'. It is noted that FIG. 10 only shows one layer but FIG. 11 shows multiple layers of the capacitor structure 40. Referring to FIG. 11, the capacitor structure 40 is distributed in multiple metal layers of the interconnect structure 36. The current example shows 5 metal layers labeled as M(n), M(n+1), M(n+2), M(n+3), and M(n+4), respectively. The numeral "n" is 0, 1, 2, or etc. Various features in different metal layers are connected by via features, labeled as "V" in FIG. 11. In the current embodiment, the capacitor structure 40 further includes shielding features distributed in the metal layers M(n) and M(n+4), respectively. The collective capacitor 42 is distributed in 3 metal layers, M(n+1), M(n+2) and M(n+3), sandwiched by the shielding features.

The branch features are interdigitated in two directions. Specifically, the first side branch features 74 and the second branch features 80 are disposed in the second region 60 and configured as an array in the plane defined by the X axis and the Z axis. The first side branch features 74 are interdigitated with the second branch features 80 along the X axis and the Z axis. State differently, the array includes a first subset of the first side branch features 74 and the second branch features 80 aligned along the X axis. The first side branch features 74 in the first subset are interdigitated with the second branch features 80 in the first subset along the X axis. The array further includes a second subset of the first side branch features 74 and the second branch features 80 aligned along the Z axis. The first side branch features 74 in the second subset are interdigitated with the second branch features 80 in the second subset along the Z axis.

Similarly, the second side branch features 76 and the third branch features 84 are disposed in the third region 62 and configured as an array in the plane defined by the X axis and the Z axis. The second side branch features 76 are interdigitated with the third branch features 84 along the X axis and the Z axis. State differently, the array includes a first subset of the second side branch features 76 and the third branch features 84 aligned along the X axis. The second side branch features 76 in the first subset are interdigitated with the third branch features 84 in the first subset along the X axis. The array further includes a second subset of the second side branch features 76 and the third branch features 84 aligned along the Z axis. The second side branch features 76 in the second subset are interdigitated with the third branch features 84 in the second subset along the Z axis.

Figure 12:
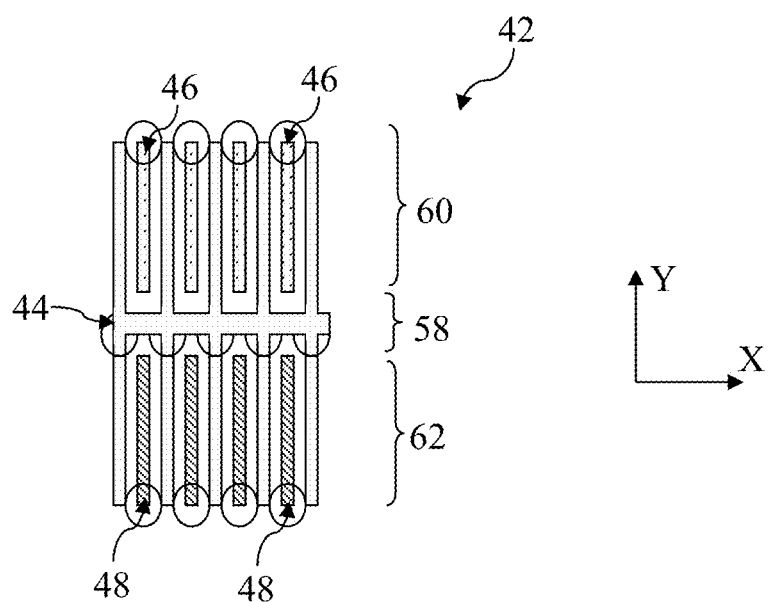
FIG. 12 is a top view of the capacitor structure of FIG. 4 in another embodiment.

FIG. 12 is a fragmentary top view of the collective capacitor 42 of the capacitor structure 40 in another embodiment. The collective capacitor 42 includes the first conductive component 44, the second conductive component 46, and the third conductive component 48. The collective capacitor 42 is formed in various regions of the substrate. Specifically, a first region 58 is adjacent a second region 60 from one side and is adjacent a third region 62 from another side.

The first, second and third conductive components 44/46/48 each include a plurality of branch features. Particularly, the first conductive component 44 includes a first stem feature 72 and a plurality of first branch features that connect with the first stem feature 72 and extend to both sides of the first stem feature 72, as further illustrated in FIG. 7. The first branch features on one side are referred to as left branch features (or first side branch features) 74 and the first branch features on another side are referred to as right branch features (or second side branch features) 76. The first stem feature 72 is extended in the X direction while the left and right branch features are extended in the Y direction perpendicular to the X direction. The first stem feature 72 is disposed within the first region 58. The left branch features 74 are extended from the first stem feature 72 to the second region 60. The right branch features 76 are extended from the first stem feature 72 to the third region 62.

The second conductive component 46 includes a plurality of second branch features that connect to other portion of the second conductive component through via features. The second branch features are extended in the Y direction and are disposed within the second region 60. The circles in FIG. 12 show where the via features to be disposed in the present embodiment.

The third conductive component 48 includes a plurality of third branch features that connect to other portion of the third conductive component through via features. The third branch features are extended in the Y direction and are disposed within the third region 62.

Furthermore, the first side branch features 74 of the first conductive component 44 and the second branch features of the second conductive component 46 are interdigitated in the second region 60. In one embodiment, the first side branch features 74 of the first conductive component 44 and the second branch features 80 of the second conductive component 46 are interdigitated in the X direction. Similarly, the second side branch features 76 of the first conductive component 44 and the third branch features of the third conductive component 48 are interdigitated in the third region 62. In one embodiment, the second side branch features of the first conductive component 44 and the third branch features of the third conductive component 48 are interdigitated in the X direction.

Figure 13:
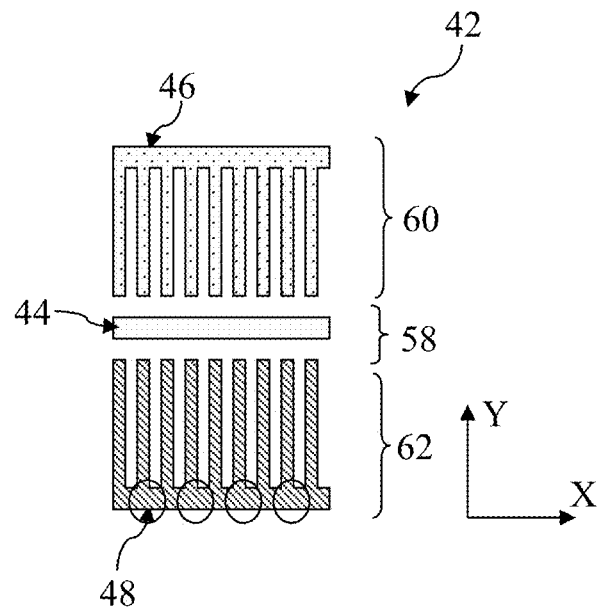
FIG. 13 is a top view of the capacitor structure of FIG. 4 in another embodiment.

FIG. 13 is a fragmentary top view of the collective capacitor 42 of the capacitor structure 40 in another embodiment. The collective capacitor 42 includes the first conductive component 44, the second conductive component 46, and the third conductive component 48. The collective capacitor 42 is formed in various regions of the substrate.

The first, second and third conductive components 44/46/48 each include a stem feature. Particularly, the first conductive component 44 includes a first stem feature aligned in the X direction and disposed in the first region 58.

The second conductive component 46 includes a second stem feature 78 and a plurality of second branch features 80 that connect to the second stem feature 78 as illustrated in FIG. 8. The second stem feature 78 is extended in the X direction and the second branch features 80 are extended in the Y direction. Both the second stem feature 78 and the second branch features 80 are disposed within the second region 60.

The third conductive component 48 includes a third stem feature 82 and a plurality of third branch features 84 that connect to the third stem feature 82 as illustrated in FIG. 9. The third stem feature 82 is extended in the X direction and the third branch features 84 are extended in the Y direction. Both the third stem feature 82 and the third branch features 84 are disposed within the third region 62.

Figure 14:
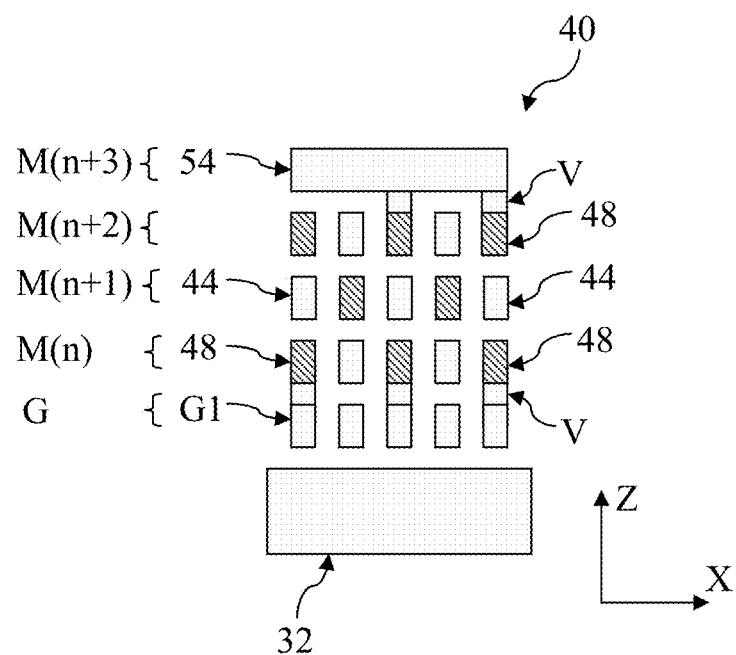
FIG. 14 is a sectional view of the capacitor structure of FIG. 4 in another embodiment.
Figure 15:
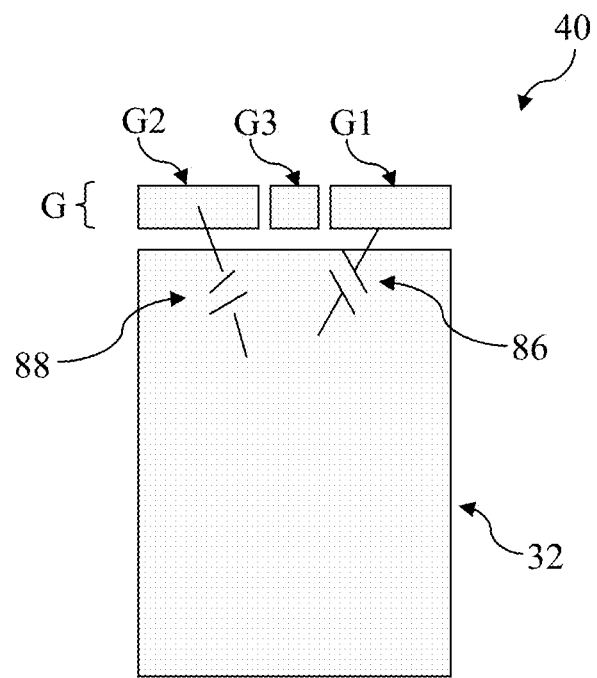
FIG. 15 is a diagrammatical view of the capacitor structure of FIG. 4 in another embodiment.

FIG. 14 is a fragmentary sectional view of the capacitor structure 40 and FIG. 15 is a diagrammatic sectional view of the capacitor structure 40 constructed according to various embodiments. Referring to FIG. 14, the capacitor structure 40 includes shielding features surrounding the collective capacitor 42. The collective capacitor 42 is distributed in multiple metal layers of the interconnect structure disposed on the substrate 32. The portion of the collective capacitor 42 disposed in respective metal layer may be designed to have a symmetrical structure but with different configurations, such as those shown in FIGS. 7, 10, 12 and/or 13. Various portions of the collective capacitor 42 are stacked. In the present embodiment, the capacitor structure 40 is distributed in multiple metal layers of the interconnect structure 36. The current example shows 4 metal layers labeled as M(n), M(n+1), M(n+2), and M(n+3), respectively. The numeral "n" is 0, 1, 2, or etc. Various features in different metal layers are connected by via features, labeled as "V". In the current embodiment, the capacitor structure 40 further includes shielding features (e.g. 54) disposed in the metal layer M(n+3). The collective capacitor 42 is distributed in 3 metal layers, M(n), M(n+1) and M(n+2).

In the present embodiment, the branch features are interdigitated in two directions. Specifically, the first side branch features 74 and the second branch features 80 are disposed in the second region 60 and configured as an array in the plane defined by the X axis and the Z axis. The first side branch features 74 are interdigitated with the second branch features 80 along the X axis and the Z axis. State differently, the array includes a first subset of the first side branch features 74 and the second branch features 80 aligned along the X axis. The first side branch features 74 in the first subset are interdigitated with the second branch features 80 in the first subset along the X axis. The array further includes a second subset of the first side branch features 74 and the second branch features 80 aligned along the Z axis. The first side branch features 74 in the second subset are interdigitated with the second branch features 80 in the second subset along the Z axis.

Similarly, the second side branch features 76 and the third branch features 84 are disposed in the third region 62 and configured as an array in the plane defined by the X axis and the Z axis. The second side branch features 76 are interdigitated with the third branch features 84 along the X axis and the Z axis. State differently, the array includes a first subset of the second side branch features 76 and the third branch features 84 aligned along the X axis. The second side branch features 76 in the first subset are interdigitated with the third branch features 84 in the first subset along the X axis. The array further includes a second subset of the second side branch features 76 and the third branch features 84 aligned along the Z axis. The second side branch features 76 in the second subset are interdigitated with the third branch features 84 in the second subset along the Z axis.

Furthermore, the capacitor 40 further includes varactors formed on the substrate 32 and connected to the second conductive component 46 and the third conductive component 48, respectively, forming a differential MOSFET varactor. In this case, the substrate 32 may be heavily N-type or P-type doped. Specifically, the second conductive component 46 and the third conductive component 48 are connected to respective gate electrodes of the respective varactors, through via features "V", as illustrated in FIGS. 14 and 15. In the present embodiment, the capacitor structure 40 includes a first gate electrode "G1" and a second gate electrode "G2" and my further include a third gate electrode "G3". The gate electrodes G1, G2 and G3 are formed in a same layer, collectively referred to as a gate layer, labeled as "G". The second conductive component 46 is connected to the first gate electrode G1 of a first varactor 86 and the third conductive component 48 is connected to the second gate electrode G2 of a second varactor 88.

Figure 16:
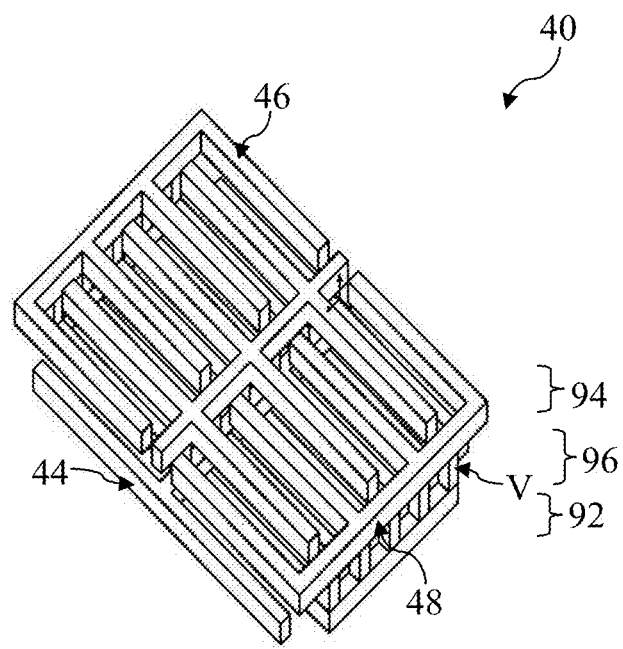
FIG. 16 is a perspective view of the capacitor structure of FIG. 4 in another embodiment.
Figure 17:
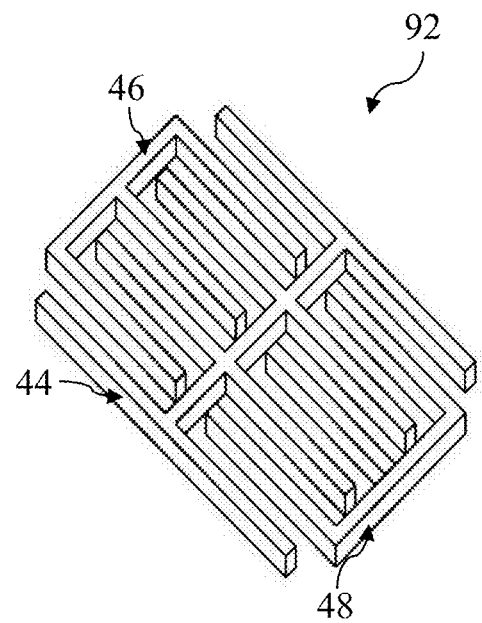
FIGS. 17 and 18 are fragmentary perspective views of the capacitor structure of FIG. 16.
Figure 18:
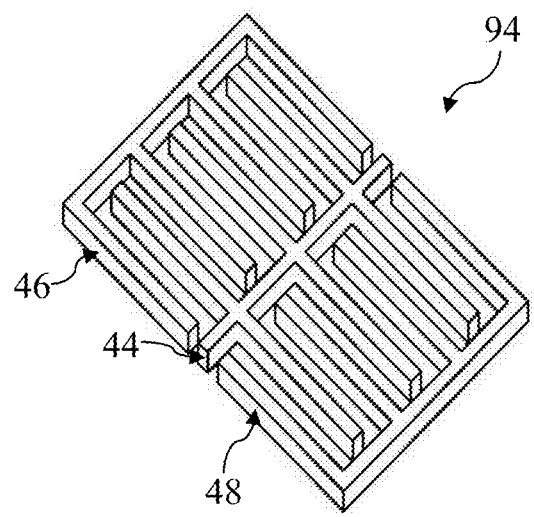

FIG. 16 is a perspective view of the capacitor structure 40, FIGS. 17 and 18 are fragmentary perspective views of the capacitor structure 40 constructed according to one or more embodiments. The capacitor structure 40 is distributed in various metal layers of the interconnect structure 36. In the present embodiment, the capacitor structure 40 is distributed in two metal layers 92/94 and a via layer 96. The via layer 96 includes a plurality of via features "V" configured to connect various features of the two metal layers. A portion of the capacitor structure 40 in the first metal layer 92 is further illustrated in FIG. 17 and another portion of the capacitor structure 40 in the second metal layer 94 is further illustrated in FIG. 18. The two portions are stacked on to form a symmetrical structure in a top view.

Figures 19, 20:
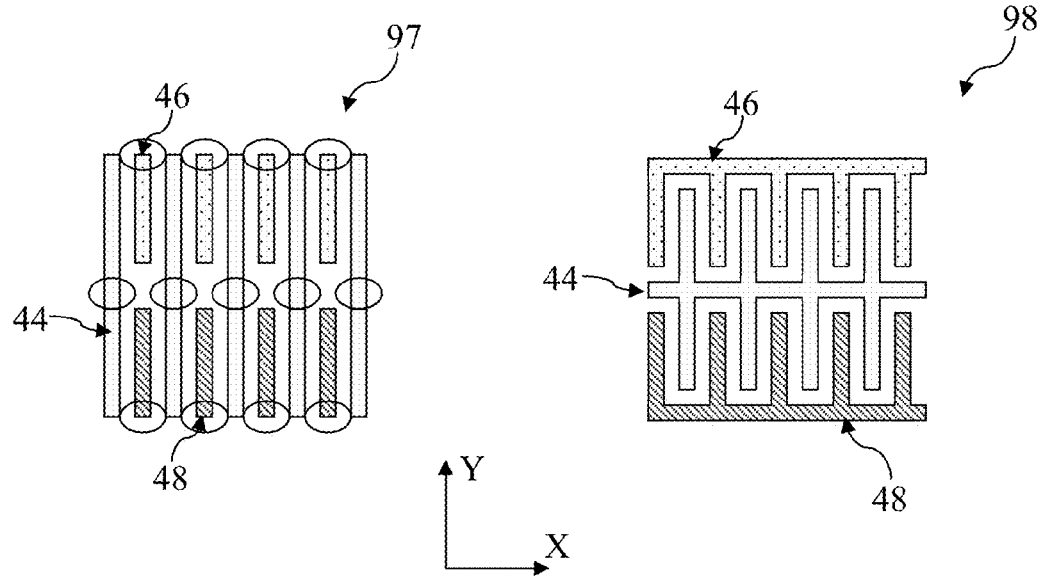
FIG. 19 is a top view of the capacitor structure of FIG. 3 in another embodiment.
FIG. 20 is a perspective view of the capacitor structure of FIG. 3 in another embodiment.
Figure 21:
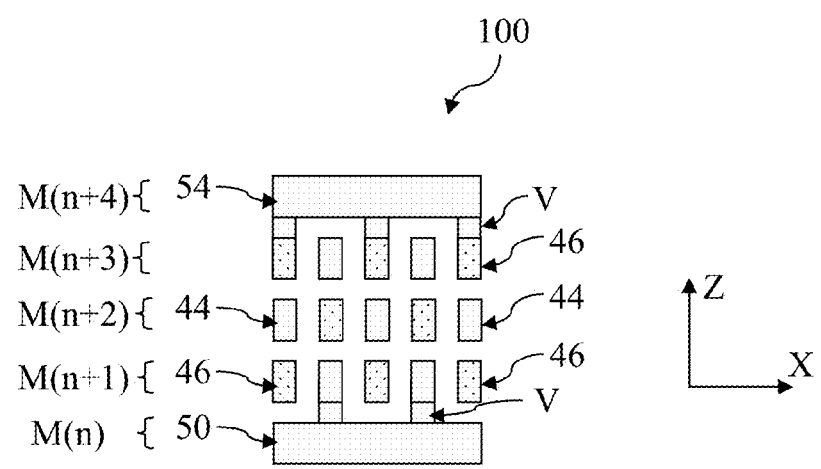
FIG. 21 is a sectional view of the capacitor structure of FIG. 3 in another embodiment.

FIG. 19 is a fragmentary top view of a capacitor structure 97, FIG. 20 is a fragmentary top view of a capacitor structure 98 and FIG. 21 is a sectional view of a capacitor structure 100. Various embodiment of the capacitor structure 40 are described with reference to FIGS. 19, 20 and 21, respectively.

Referring to FIG. 19 according to one embodiment, the capacitor structure 97 includes first, second and third conductive components 44, 46 and 48. The first component 44 includes a plurality of first features in parallel and aligned in the Y direction. The second component 46 includes a plurality of second features in parallel and aligned in the Y direction. The third component 48 includes a plurality of third features in parallel and aligned in the Y direction. The first features are interdigitated with the second features along the X direction. The first features are interdigitated with the third features along the X direction as well, as illustrated in FIG. 19.

Referring to FIG. 20 according to another embodiment, the capacitor structure 98 includes first, second and third conductive components 44, 46 and 48. The capacitor structure 98 is similar to that of FIG. 6. For example, the first component 44 includes a first stem feature and a plurality of first branch features connected to the first stem feature. The first branch features further include first side branch features and second side branch features. The second component 46 includes a second stem feature and a plurality of second branch features connected to the second stem feature. The third component 48 includes a third stem feature and a plurality of third branch features connected to the third stem feature. The first branch features (or particularly, first side branch features) are interdigitated with the second branch features along the X direction. The first branch features (or particularly, second side branch features) are interdigitated with the third features along the X direction as well, as illustrated in FIG. 20.

Referring to FIG. 21 according to another embodiment, the capacitor structure 100 is distributed in multiple metal layers of the interconnect structure 36. The capacitor structure 100 is similar to the capacitor structure of FIG. 11. The capacitor structure 100 includes one or more structure 97 and one or more structure 98 stacked in an alternating sequence. Various features of the structure 97 are, respectively, connected to corresponding features of the structure 98 stacked below or above, through via features. Circles in FIG. 19 show where via features are disposed according to one example. Furthermore, shielding features (such as 50, 52 and 54) are configured to be surrounding the capacitor structure 100 and are connected to respective conductive components, respectively.

Figures 22, 23:
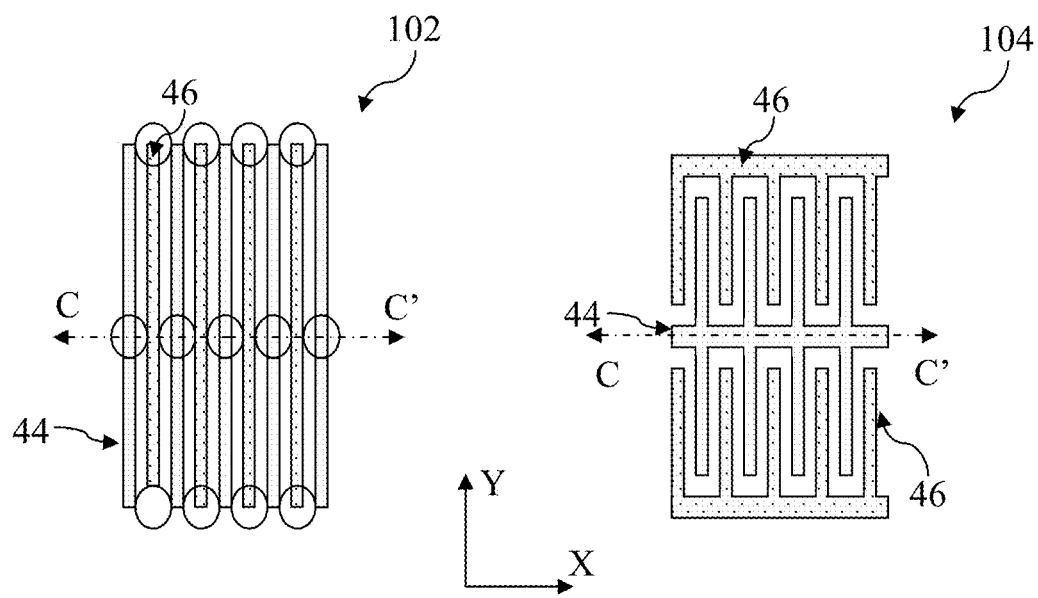
FIG. 22 is a top view of the capacitor structure of FIG. 3 in another embodiment.
FIG. 23 is a perspective view of the capacitor structure of FIG. 3 in another embodiment.
Figure 24:
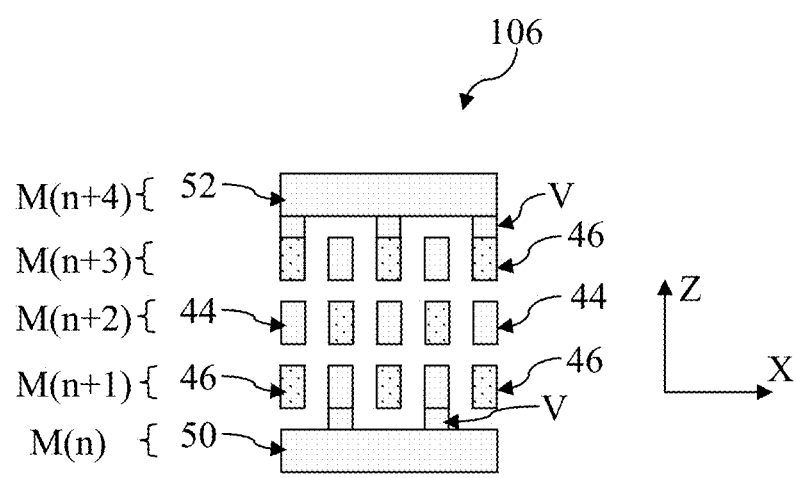
FIG. 24 is a sectional view of the capacitor structure of FIG. 3 in another embodiment.

FIG. 22 is a fragmentary top view of a capacitor structure 102, FIG. 23 is a fragmentary top view of a capacitor structure 104 and FIG. 24 is a sectional view of a capacitor structure 106. Various embodiment of the capacitor structure 40 are described with reference to FIGS. 19, 20 and 21, respectively.

Referring to FIG. 22 according to one embodiment, the capacitor structure 102 includes first and second conductive components 44 and 46 but not the third conductive component. In a different perspective, structure 102 can be viewed as a modified version of the structure 97 in FIG. 19 where the second conductive component 46 and the third conductive component 48 are connected. Therefore, only two conductive components 44 and 46 are present in the capacitor structure 102. Those two conductive components 44 and 46 may also be referred to as cathode component 44 and anode component 46. The first conductive component 44 includes a plurality of first features in parallel and aligned in the Y direction. The second component 46 includes a plurality of second features in parallel and aligned in the Y direction. The first features are interdigitated with the second features along the X direction.

Referring to FIG. 23 according to another embodiment, the capacitor structure 104 includes first and second conductive components 44 and 46. The capacitor structure 104 can be viewed as a modified version of the structure 98 in FIG. 20 where the second conductive component 46 and the third conductive component 48 are configured to be connected, therefore collectively referred to as the second conductive component 46. The first component 44 includes a first stem feature and a plurality of first branch features connected to the first stem feature. The second component 46 includes a second stem feature and a plurality of second branch features connected to the second stem feature. The first branch features are interdigitated with the second branch features along the X direction.

Referring to FIG. 24 according to another embodiment, the capacitor structure 106 is distributed in multiple metal layers of the interconnect structure 36. The capacitor structure 106 is similar to the capacitor structure 100 of FIG. 21. However, the capacitor structure 106 only includes two conductive components (cathode and anode component). The capacitor structure 106 includes one or more structure 102 and one or more structure 104 stacked in an alternating sequence. Various features of the structure 102 are, respectively, connected to corresponding features of the structure 104 stacked below or above, through via features. Circles in FIG. 22 show where via features are disposed according to one example. Furthermore, shielding features (such as 50 and 52) are configured to be surrounding the capacitor structure 106 and are connected to respective conductive components, respectively. For example, the shielding feature 50 is disposed on the top and is connected to the first conductive component 44, and the shielding feature 52 is disposed on the bottom and is connected to the second conductive component 46.

In a particular embodiment, the capacitor structure 106 (102 and 104 as well) is designed symmetrically. In a top view, a virtual line CC' splits the capacitor structure into two portions, a first portion on one side and a second portion on another side of the virtual line CC'. The first and second portions are designed and configured symmetrically.

Although various embodiments are described, other embodiments of the capacitor structure may be used according to the present disclosure. In one example, the shield structure may include a subset of the side portions, the top portion and the bottom portion. In another example, each branch features may include two or more metal lines connected through via features. It is understood that additional processes may be performed to complete the fabrication of the capacitor structure. For example, these additional processes may include deposition of passivation layers, packaging, and testing. For the sake of simplicity, these additional processes are not described herein.

A semiconductor device is disclosed according to one of the broader forms of the present disclosure. In one embodiment, the present disclosure provides an integrated circuit. The integrated circuit includes a substrate having a surface that is defined by a first axis and a second axis perpendicular to the first axis; and a capacitor structure disposed on the substrate. The capacitor structure includes a first conductive component; a second conductive component and a third conductive component symmetrically configured on opposite sides of the first conductive component. The first, second and third conductive components are separated from each other by respective dielectric material.

The present disclosure provides a semiconductor structure in another embodiment. The semiconductor structure includes a substrate having a surface that is defined by a first axis and a second axis perpendicular to the first axis. The substrate includes a first region, a second region and a third region, the first region is interposed between the second and third regions. The semiconductor structure also includes a differential capacitor disposed on the substrate. The differential capacitor includes a first conductive component having a first stem feature that is disposed in the first region; a second conductive component disposed in the second region; a third conductive component disposed in the third region. The second and third conductive components are symmetrically designed and symmetrically configured on opposite sides of the first conductive component.

The present disclosure provides a method of fabricating an integrated circuit in another embodiment. The method includes providing a substrate having a surface that is defined by a first axis and a second axis that is perpendicular to the first axis; and forming an interconnect structure over the surface of the substrate. The interconnect structure includes layers of conductive lines and levels of conductive vias interconnecting the layers of conductive lines. The forming of the interconnect structure includes forming a capacitor structure disposed on the substrate. The capacitor structure includes a first conductive component, and a second conductive component and a third conductive component symmetrically configured on opposite sides of the first conductive component, wherein the first, second and third conductive components are separated from each other by respective dielectric material.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
   a substrate having a surface that is defined by a first axis and a second axis perpendicular to the first axis; and
   a capacitor structure disposed on the substrate, wherein the capacitor structure includes:
      a first conductive component,
      a second conductive component and a third conductive component symmetrically configured on opposite sides of the first conductive component, wherein the first, second, and third conductive components are separated from each other by a respective dielectric material,
      a first conductive shielding feature electrically connected to the first conductive component, and
      a second conductive shielding feature electrically connected to the second conductive component.

2. The integrated circuit of claim 1, wherein:
   the first conductive component is configured to be connected to a first signal line; and
   the second and third conductive components are configured to be connected to a second signal line.

3. The integrated circuit of claim 1, wherein:
   the first conductive component is configured to be connected to a first signal line;
   the second conductive component is configured to be connected to a second signal line; and
   the third conductive component is configured to be connected to a third signal line different from the second signal line.

4. The integrated circuit of claim 3, wherein:
   the first signal line is a ground line;
   the second signal line is a power line of a first alternating current with a first magnitude and a first phase; and
   the third signal line is another power line of a second alternating current with the first magnitude and a second phase opposite to the first phase.

5. The integrated circuit of claim 1, wherein:
   the first conductive component includes a first stem feature oriented in the first axis;
   the second conductive component is disposed on a first side of the first conductive component and includes a plurality of first branch features oriented in the second axis; and
   the third conductive component is disposed on a second side of the first conductive component and includes a plurality of second branch features oriented in the second axis.

6. The integrated circuit of claim 5, wherein:
   the second conductive component further includes a second stem feature oriented in the first axis and connected to the plurality of first branch features; and
   the third conductive component further includes a third stem feature oriented in the first axis and connected to the plurality of second branch features.

7. The integrated circuit of claim 6, wherein:
   the first conductive component further includes a plurality of third branch features oriented in the first axis and connected to the first stem feature;
   each of the third branch features includes a first segment extended to the first side and a second segment extended to the second side of the first stem feature; and
   the third branch features are interdigitated with the first branch features on the first side and interdigitated with the second branch features on the second side.

8. The integrated circuit of claim 1, further comprising an interconnect structure having a plurality of conductive layers on the substrate, wherein:
   each of the conductive layers includes a plurality of conductive lines;
   neighboring two of the conductive layers are connected through via features; and
   the first, second, and third conductive components are distributed in the plurality of conductive layers and via features.

9. The integrated circuit of claim 1, further comprising a first varactor and a second varactor formed on the substrate, wherein:
   the first conductive component is connected to the first varactor; and
   the second conductive component is connected to the second varactor.

10. The integrated circuit of claim 1, wherein the first, second, and third conductive components includes a conductive material selected from the group consisting of metal, metal alloy, metal silicide, and combinations thereof.

11. The integrated circuit of claim 1, wherein:
    the first conductive component includes a plurality of first features oriented in the first axis;
    the second conductive component includes a plurality of second features oriented in the first axis;
    the third conductive component includes a plurality of third features oriented in the first axis;
    the plurality of second and third features are configured into pairs, wherein each pair includes one of the second features and one of the third features;
    the one of the second features and the one of the third features in each pair are disposed in a same line oriented in the first axis; and
    the first features are interdigitated with the pairs of the second and third features.

12. A semiconductor structure, comprising:
    a substrate having a surface that is defined by a first axis and a second axis perpendicular to the first axis, wherein the substrate includes a first region, a second region, and a third region, wherein the first region is interposed between the second and third regions; and
    a differential capacitor disposed on the substrate, wherein the differential capacitor includes:
       a first conductive component having a first stem feature that is disposed in the first region,
       a second conductive component disposed in the second region;
       a third conductive component disposed in the third region, wherein the second and third conductive components are symmetrically designed and symmetrically configured on opposite sides of the first conductive component;
a first conductive shielding feature electrically connected to the first conductive component; and
a second conductive shielding feature disposed in the third region and electrically connected to the third conductive component.

13. The semiconductor structure of claim 12, wherein:
the first conductive component further includes a plurality of first branch features oriented in the second axis, connected to the first stem feature, and extended into the second region;
the first conductive component further includes a plurality of second branch features oriented in the second axis, connected to the first stem feature, and extended into the third region;
the second conductive component includes a second stem feature oriented in the first axis and a plurality of third branch features oriented in the second axis, the third branch features being connected to the second stem feature; and
the third conductive component includes a third stem feature oriented in the first axis and a plurality of fourth branch features oriented in the second axis, the fourth branch features being connected to the third stem feature.

14. The semiconductor structure of claim 13, wherein:
the first branch features are interdigitated with the third branch features in the second region; and
the second branch features are interdigitated with the fourth branch features in the third region.

15. The semiconductor structure of claim 14, wherein:
the first branch features are interdigitated with the third branch features along the first axis and a third axis that is perpendicular to the first axis and the second axis; and
the second branch features are interdigitated with the fourth branch features along the first axis and the third axis.

16. The semiconductor structure of claim 12, further comprising a third shielding feature connected to the first conductive component and disposed in the first, second, and third regions, wherein the first, second, and third shielding features are configured such that:
the first and second shielding features are disposed on one side of the first, second, and third conductive components;
the third shielding feature is disposed on an opposite side of the first, second, and third conductive components; and
the first, second, and third conductive components are sandwiched by the first, second, and third shielding features.

17. The semiconductor device of claim 12, wherein:
the first, second, and third conductive components each include a plurality of metal lines, each metal line belonging to a different metal layer of an interconnect structure; and
a plurality of groups of metal vias, each group of metal vias interconnecting two of the plurality of metal lines along a third axis.

* * * * *